United States Patent [19]

Talreja

[11] Patent Number: 5,742,787
[45] Date of Patent: Apr. 21, 1998

[54] HARDWARE RESET OF A WRITE STATE MACHINE FOR FLASH MEMORY

[75] Inventor: Sanjay S. Talreja, Folsom, Calif.

[73] Assignee: Intel Corporation, Santa Clara, Calif.

[21] Appl. No.: 419,357

[22] Filed: Apr. 10, 1995

[51] Int. Cl.⁶ ................................................ G06F 12/00
[52] U.S. Cl. ................................ 395/430; 395/481
[58] Field of Search .......................... 395/430, 481, 395/493, 494; 365/185.11, 185.29, 185.33, 218

[56] References Cited

U.S. PATENT DOCUMENTS

| | | | |
|---|---|---|---|
| 5,287,469 | 2/1994 | Tsuboi | 395/430 |
| 5,351,216 | 9/1994 | Salt | 365/230.01 |
| 5,414,829 | 5/1995 | Fandrich | 395/428 |
| 5,509,134 | 4/1996 | Fandrich | 395/430 |

*Primary Examiner*—Tod R. Swann
*Assistant Examiner*—Christopher S. Chow
*Attorney, Agent, or Firm*—Blakely, Sokoloff, Taylor & Zafman

[57] ABSTRACT

A method of quickly aborting an automated program or erase sequence on a nonvolatile memory array in which each operation of the sequence is performed by a write state machine. During each operation of the program or erase sequence, the state of an abort signal is detected to determine whether or not the sequence should be aborted. If the abort signal is in a second state, the sequence continues to the next operation. If the abort signal is in a first state, the write state machine aborts the sequence and the nonvolatile memory array is placed in a read-only mode. The nonvolatile memory array is then available for user access.

17 Claims, 4 Drawing Sheets

1

HARDWARE RESET OF A WRITE STATE MACHINE FOR FLASH MEMORY

FIELD OF THE INVENTION

The present invention relates to the field of nonvolatile memory devices. More particularly, the present invention relates to a method of aborting an automatic program or erase sequence performed on a nonvolatile memory array.

BACKGROUND OF THE INVENTION

One type of prior nonvolatile memory is flash electrically erasable programmable read only memory (flash EEPROM, or "flash memory").

Flash memory combines erase features of prior nonvolatile memory types. Like prior electrically erasable programmable read only memory (EEPROM), flash memory may be erased electrically without being removed from the computer system. Flash memory is also similar to erasable programmable read only memory (EPROM) because flash memory is arranged in blocks such that the entire contents of each block must be erased at once.

For one type of flash memory manufactured by Intel Corporation of Santa Clara, Calif., an EPROM tunnel oxide (ETOX) technology is used. The ETOX technology employs a single "floating gate" memory transistor to hold one bit of data. The programming of the memory transistor brings the value of the bit to a logical "0". Programming is accomplished by applying a large positive voltage to a select gate, applying a similar voltage to the drain, and grounding the source of the memory transistor. The select gate is positioned above the floating gate such that electrons are hot injected into the floating gate.

Erasure of the flash memory brings the value of the bit to a logical "1". A large positive voltage is applied to the source of the memory transistor, causing electrons to be tunneled away from the floating gate. Flash memory transistors can be grouped together in blocks that are individually erasable. A single flash memory array contains several blocks. Alternatively, a flash memory array may comprise one block.

The erasure process of a flash memory array typically involves several steps. For flash memories of Intel Corporation, precondition and postcondition steps are employed. First, the transistors of the block to be erased are preconditioned, whereby the threshold voltages of the memory transistors are increased. The preconditioned transistors are then erased and verified. Certain transistors may have been over-erased, and hence may have negative threshold voltages. These transistors are postconditioned to bring their threshold voltages back up to a certain minimum level. The programming process is similarly comprised of various steps. One such step is program set-up, where the internal circuitry required for programming is reset. Flash memory transistors are then programmed and verified to ensure the programming was successful.

One type of Intel flash memory is qualified to withstand a minimum of 100,000 programming and erasure cycles before device degradation or failure. This cycle lifetime is further extended to 1,000,000 cycles when flash memory devices incorporate wear-leveling algorithms that distribute data amongst flash memory blocks.

Prior flash memory devices that do not contain logic to control program and erase sequences burden the system microprocessor with the task of sequencing the flash memory through its program and erase steps. More recent flash memory devices manufactured by Intel Corporation have incorporated write state machines which help alleviate the heavy burden on the microprocessor. Upon receipt of a command from the microprocessor, the write state machine cycles the flash memory array through its many erase or program steps automatically, and then reports back to the microprocessor when it is finished.

In current flash memory devices incorporating a write state machine, the microprocessor cannot read from or write to the flash memory device while the erase and program sequences are being performed. The erase and program sequences can take up a significant amount of time, especially in the event of an unsuccessful erase or program step that must be repeated. This can present a problem when a microprocessor desires access to the flash memory array while the write state machine has control of the device.

One way that Intel has solved this problem is by incorporating an erase suspend function within the write state machine. The microprocessor asserts an "erase suspend" command on the data bus, causing the write state machine to pause its erase sequence. The microprocessor may then read from a block in the flash memory array which is not being accessed by the write state machine. One drawback of this prior method of suspending the write state machine is that the write state machine is not reset. The interrupted erase sequence must be resumed once the microprocessor has finished with the read cycle. Another drawback is that a microprocessor may only issue a read command while the write state machine is suspended. The erase suspend method is therefore not sufficient when the microprocessor wishes to abort the write state machine in order to perform another program or erase operation.

Prior flash memory devices manufactured by Intel Corporation also enable a microprocessor to abort the operations of the write state machine by placing the flash memory device in the "sleep mode." The sleep mode is entered when an active signal is asserted on an $\overline{RP}$ pin of the flash memory device. The sleep mode is also entered when a microprocessor writes a "sleep" command to the flash memory device over the data bus. The assertion of either the $\overline{RP}$ pin or the sleep command completely aborts the program or erase sequence and resets the write state machine. The flash memory device is then placed in the sleep mode, where most internal circuits are turned off. The amount of time it takes for the flash memory device to be powered down to the sleep mode, and then powered back up to the read mode, can be significant. The sleep mode method of aborting the operations of the write state machine is therefore not efficient for times when the microprocessor needs to quickly regain access to the flash memory array. Moreover, entering the sleep mode while the write state machine is in the midst of a sequence requires that the high program and erase voltages be quickly removed from the flash memory array transistors. Repeatedly entering the sleep mode during an erase or program sequence could therefore place undue stress on the flash memory transistors, eventually decreasing the lifetime of the device.

Therefore, neither the erase suspend command nor the sleep command sufficiently enables the microprocessor to completely abort a program or erase sequence and quickly regain control of the flash memory device.

SUMMARY AND OBJECTS OF THE INVENTION

It is a therefore an object of the invention to decrease the amount of time required to interrupt a write state machine sequence and return control to the microprocessor.

It is a further object of the invention to minimize stress placed on transistors of the memory array when a write state machine sequence is aborted.

A memory device employing a method for aborting an automated write sequence on a nonvolatile memory array is described. The write sequence includes many operations to be automatically performed by a write state machine on the nonvolatile memory array. The write state machine commences the write sequence upon receipt of an appropriate command. During each operation of the write sequence, the write state machine detects the state of an abort signal. If the abort signal is detected in the second state, the write state machine continues with the next operation of the sequence. If the abort signal is detected in the first state, the write state machine halts the write sequence and the nonvolatile memory array is placed in a read-only mode.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method for aborting an automated flash memory program or erase sequence and implementation in a flash memory device is described. The method provides the user of a flash memory device with an option to abort a program or erase sequence at any time and quickly regain control of the flash memory array. The flash memory device includes a write state machine for automatically sequencing the program and erase operations.

The method may be activated in one of two ways. An abort command may be sent to the flash memory device, or an asynchronous abort signal may be asserted on a pin coupled to the flash memory device. For an alternative embodiment, the flash memory device does not include an abort pin and therefore only the abort command is used. Another embodiment includes only an abort pin, and no means by which the user may assert an abort command.

A memory device and method of aborting the automatic programming and erasure of a flash memory array will be described in more detail below.

Figure 1:
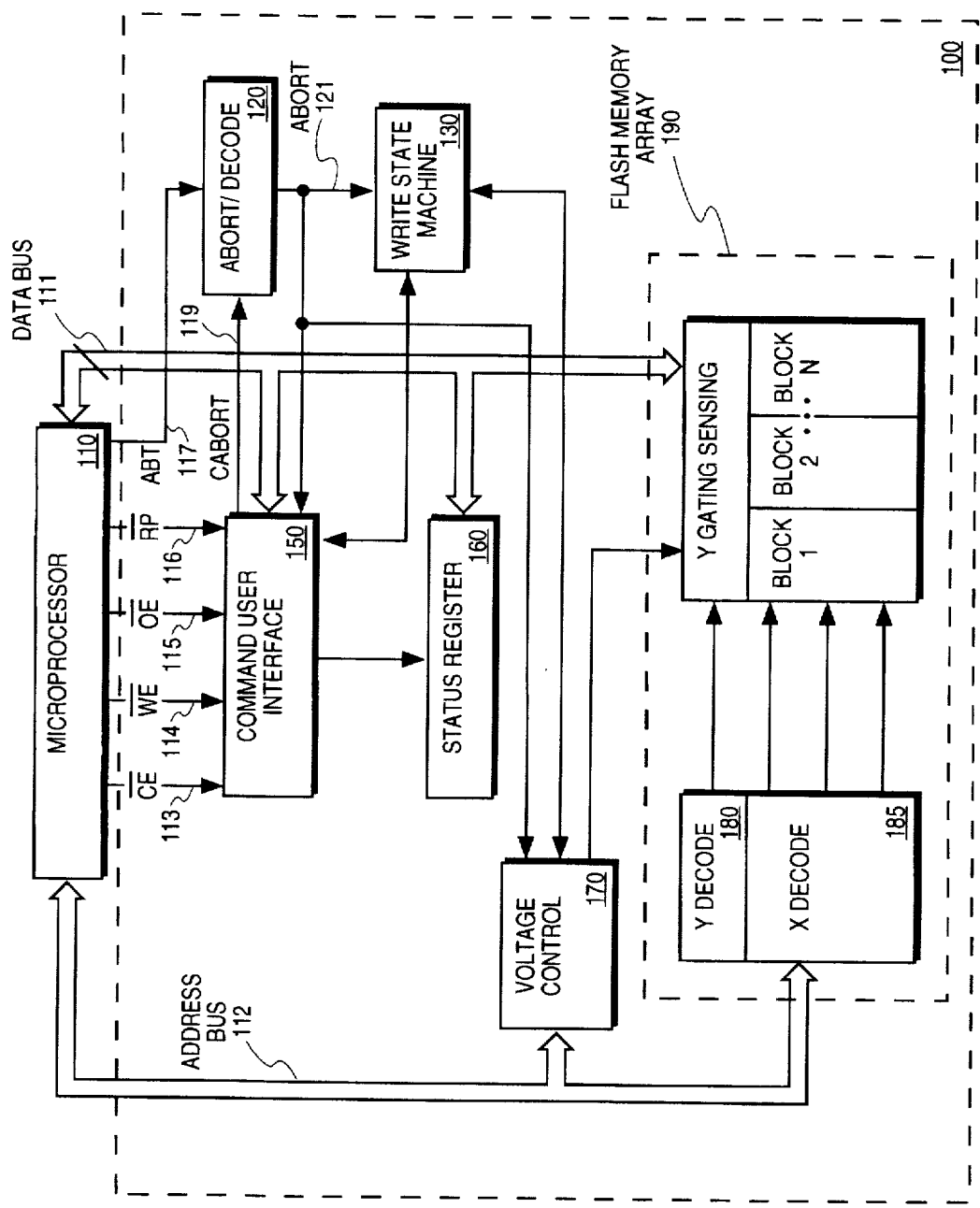
FIG. 1 is a block diagram of a flash memory card employing circuitry to abort an automatic write sequence on a flash memory array.

FIG. 1 illustrates in block diagram form an embodiment of the present invention incorporated in a flash memory device 100. The flash memory device 100 is fabricated on a single semiconductor substrate.

Microprocessor 110 accesses the flash memory array 190 by asserting commands on data bus 111 and addresses on address bus 112. Flash memory device 100 is suitable for use in a variety of systems such as personal computers, electronic organizers, automobile control systems, and laser printers. Thus alternative embodiments of the microprocessor 110 include a microcontroller, a state machine, an application specific integrated circuit (ASIC), and other devices capable of controlling the memory device 110.

Flash memory array 190 is comprised of a number of blocks of flash memory cells. For another embodiment, the memory array 190 is comprised of only one block. During memory array accesses, the X decoder 180 receives the address from microprocessor 110 on address bus 112 and selects the appropriate row within the flash memory array 190. The Y decoder 185 similarly receives the address and selects the appropriate column within flash memory array 190.

The flash memory device 100 communicates with the microprocessor 110 via the data bus 111, the address bus 112, and other pins coupled to the flash memory device 100. For the embodiment shown in FIG. 1, a bar over the pin name, e.g. $\overline{CE}$, indicates that the pin is active low. An active low pin is active when a logical zero signal is coupled to the pin, and inactive when a logical one signal is coupled to the pin. A pin name without a bar over it, e.g. ABT, indicates that the pin is active high.

The $\overline{CE}$ pin 113 is the chip enable pin which controls the power of the flash memory device 100. When the $\overline{CE}$ pin 113 is active, internal control and buffer circuits of flash memory device 100 are turned on. When $\overline{CE}$ pin 113 is inactive, the flash memory device is placed in a low power standby mode. For an alternative embodiment the flash memory device 100 includes more than one $\overline{CE}$ pin, such that when all $\overline{CE}$ pins are active the device 100 is selected. This embodiment is especially useful for large arrays comprising several flash memory devices.

The $\overline{OE}$ pin 115 is the output enable for the flash memory device 100. When the $\overline{OE}$ pin 115 and the $\overline{CE}$ pin 113 are both active, the outputs on the data bus 111 are gated to the microprocessor 100. The $\overline{WE}$ pin 114 is the write enable pin. The write enable pin controls the writes to the command user interface 150. When the $\overline{CE}$ pin 113 is active, the flash memory device 100 latches addresses and data on the rising edge of $\overline{WE}$. Standard microprocessor timings are used.

The $\overline{RP}$ pin 116 is the reset/power down pin. When the $\overline{RP}$ pin 116 is active, the flash memory device 100 is placed in a sleep mode which consumes considerably less power than the standby mode. When the flash memory device 100 is in the sleep mode, the flash memory array 190 cannot be read from, programmed, or erased. When the $\overline{RP}$ pin 116 is pulled active, the write state machine 130 is reset and the flash memory device is placed in the sleep mode.

Erasure of a block of flash memory array 190 requires that high voltage be supplied to the memory transistors. In the absence of high voltage, the flash memory array defaults to the "read-only" mode. Voltage control circuitry 170 contains switches to supply the required voltage levels to the flash memory array 190 during read, program, and erase operations. The programming of a flash memory transistor is accomplished by applying VPP (12 volts) to the gate, VPP/2 (6 volts) to the drain, and grounding the source of the memory transistor. This process attracts electrons to the floating gate of the memory transistor by hot electron injection. The flash memory transistor is erased by applying VPP (12 volts) to the source, grounding the gate, and allowing the drain of the transistor to float. The electrons are thus tunneled away from the floating gate. Reading of a flash memory transistor is performed by applying VCC (5 volts or 3 volts) to the gate, grounding the source, and applying 1 volt to the drain. The amount of drain-source current $I_{DS}$ is then sensed to determine whether the transistor is in the programmed or erased state. For one embodiment, voltage control circuitry 170 also contains internal power circuits that supply the necessary voltages for operating the flash memory device 100 if the external supply levels are less than the required values.

The flash memory device 100 includes a write state machine 130 for performing "write" sequences, such as programming and erasure, on the flash memory array 190. The write state machine 130 performs program and erase sequences by controlling the voltages provided to the flash memory array 190 through the voltage control circuitry 170. One embodiment of the write state machine 130 comprises a microcontroller that uses microcode to control the sequencing of the flash memory array 190 for erasure and programming. For another embodiment the write state machine is a programmable logic array ("PLA").

Command user interface 150 is the interface between the microprocessor 110 and the internal operation of the flash memory device. Commands are latched to the command user interface 150 from the microprocessor 110 via the data bus 111. The command user interface 150 decodes these commands and generates signals used by other circuits in the flash memory device. When the microprocessor 110 issues a read command, the command user interface 150 points the read to either the flash memory array 190 or status register 160. When the microprocessor 110 issues a program or erase command, the command user interface 150 signals the write state machine 130 to begin the correct sequence of steps.

The programming or erasure step may be repeated several times if the verification step indicates a block was not successfully erased or programmed. The write state machine 130 typically continues to reinitiate the erase or program step either until the step is successful, or until the state machine 130 "times out."

A microprocessor 110 may desire to abort the program or erase sequence in order to read to or write from another block of the flash memory array 190. The microprocessor 110 therefore issues an "abort" command to the flash memory device 100 over the data bus 111. When the command user interface 150 receives and decodes the abort command, the command user interface 150 asserts a signal on CABORT line 119.

This synchronous method of asserting an abort command may not be responsive enough for a microprocessor 110 wishing to quickly abort the sequence currently executing. The embodiment of FIG. 1 therefore incorporates both a synchronous and asynchronous means of aborting the sequence.

For the asynchronous abort method, the microprocessor 110 asserts an active signal on ABT pin 117. The two abort lines, ABT pin 117 and CABORT from the command user interface 150, are fed into the abort decode circuitry 120. For one embodiment, the abort decode circuitry 120 acts as an OR function, such that an active signal on either line 117 or line 119 produces an active abort signal on line 121.

The active abort signal on line 121 is then routed to the write state machine 130, the command user interface 150, and the voltage control circuitry 170. Upon receipt of the active abort signal, the write state machine 130 aborts the current program or erase sequence, regardless of the step that is currently being performed on the flash memory array 190. The data in the block of flash memory array 190 that was being erased or programmed is therefore invalid.

The voltage control circuitry 170 receives the abort signal and turns off the high voltages being supplied to the flash memory array 190 in such a manner as to minimize damage to the flash memory transistors. When the voltage control circuitry 170 has completed, the flash memory array 190 is in read mode and the write state machine is reset.

The active abort signal on line 121 is also fed into the command user interface 150. Upon receipt of the active abort signal on line 121, the command user interface 150 resets, waiting for the next input from the microprocessor 110. The microprocessor 110 may then assert any desired command.

The status register 160 reflects the status of the write state machine 130 during all operations. The status register 160 reports to the microprocessor 110 (1) whether or not the write state machine 130 can accept another command, (2) whether the write state machine 130 has completed its current operation, and (3) whether the current operation was successful or unsuccessful. For an embodiment of the flash memory array 190 containing multiple blocks, the status register 160 also comprises separate block status registers that reflect the status for each separate block.

Upon normal completion of a program or erase sequence that was not aborted, the command user interface 150 resets to a "read status register" mode. In this mode, the microprocessor 110 is required to first read the status register 160 to determine whether the program or erase sequence was successful before issuing another command.

By contrast, when the program or erase sequence has been aborted, the command user interface 150 allows the microprocessor 110 to request any command. The microprocessor 110 asserting an abort command is given control of the flash memory array 190. For one embodiment of the invention, a field in the status register 160 is updated when the write state machine 130 and the voltage control circuitry 170 have completed aborting the program or erase sequence and ramping down the high voltages. Hence the microprocessor 110 may, but is not required to, read the status register 160 to determine whether the flash memory array 190 is ready for the next access. For another embodiment, a special field in the status register 160 is reserved for an abort of the write state machine 130. This field indicates whether or not the last sequence performed by the write state machine 130 was aborted.

Figure 2:
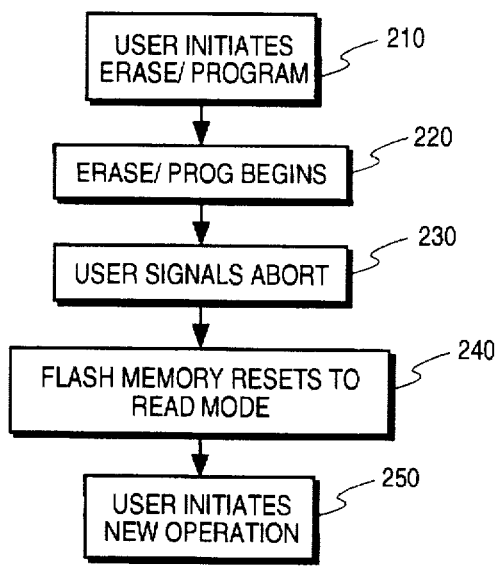
FIG. 2 is a flow diagram of a method of aborting an automatic write sequence on a flash memory array.

FIG. 2 illustrates an embodiment of a method of using the abort command or the ABT pin 117 to abort an erase or program sequence. In step 210, the microprocessor 110 initiates a program or erase sequence by asserting a command to command user interface 150. The command is decoded, and the write state machine 130 begins the erase or program sequence in step 220. The microprocessor 110 then signals an abort in step 230, either by asserting an abort command to the command user interface 150, or by asserting an active signal on the ABT pin 117. The abort signal on line 121 is then received by both the write state machine 130 and the voltage control circuitry 170 in step 240, and the flash memory device 100 is reset to the read mode. During step 240, the write state machine 130 resets to its initial state and the voltage control circuitry 170 removes the high voltages from the flash memory army 190. The microprocessor 110 then has control of the flash memory device 100 and initiates a new command in step 250.

Figure 3:
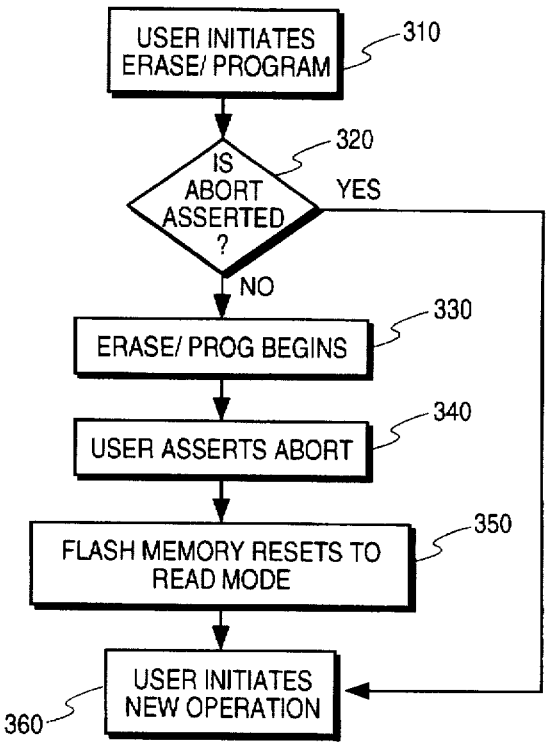
FIG. 3 is a flow diagram of a method of aborting an automatic write sequence on a flash memory array including a write protection feature.

FIG. 3 is an alternative embodiment of a method of aborting the write state machine 160 using the ABT pin 117. The method of FIG. 3 additionally uses the ABT pin 117 to write protect the flash memory array 190. At step 310, the microprocessor 110 initiates an erase or program operation by asserting the appropriate command to the command user interface 150. Step 320 embodies the write protection feature of the ABT pin 117. The write state machine 130 checks the state of the ABT pin 117 before initiating the program or erase sequence. If the ABT pin 117 is active, then the write state machine 130 will not commence the sequence. Hence the microprocessor 110 may assert an active signal on the ABT pin 117 in order to protect the flash memory array 190 from inadvertent writes. If the ABT pin 117 is inactive at step 320, then the erase or program sequence commences in step 330. The microprocessor 110 then asserts an active signal on the ABT pin 117 in step 340. The write state machine 130 detects the active abort signal 121 and resets in step 350. Additionally, the voltage control circuitry 170 receives the abort signal 121 and removes the high voltages from the flash memory array 190, placing the flash memory array 190 in the read only mode. Once the voltage control circuitry 170 and write state machine 130 have completed the reset process in step 350, the microprocessor then has control of the flash memory device 100. In step 360, the microprocessor initiates a new operation by asserting a command to the command user interface 150.

Figure 4:
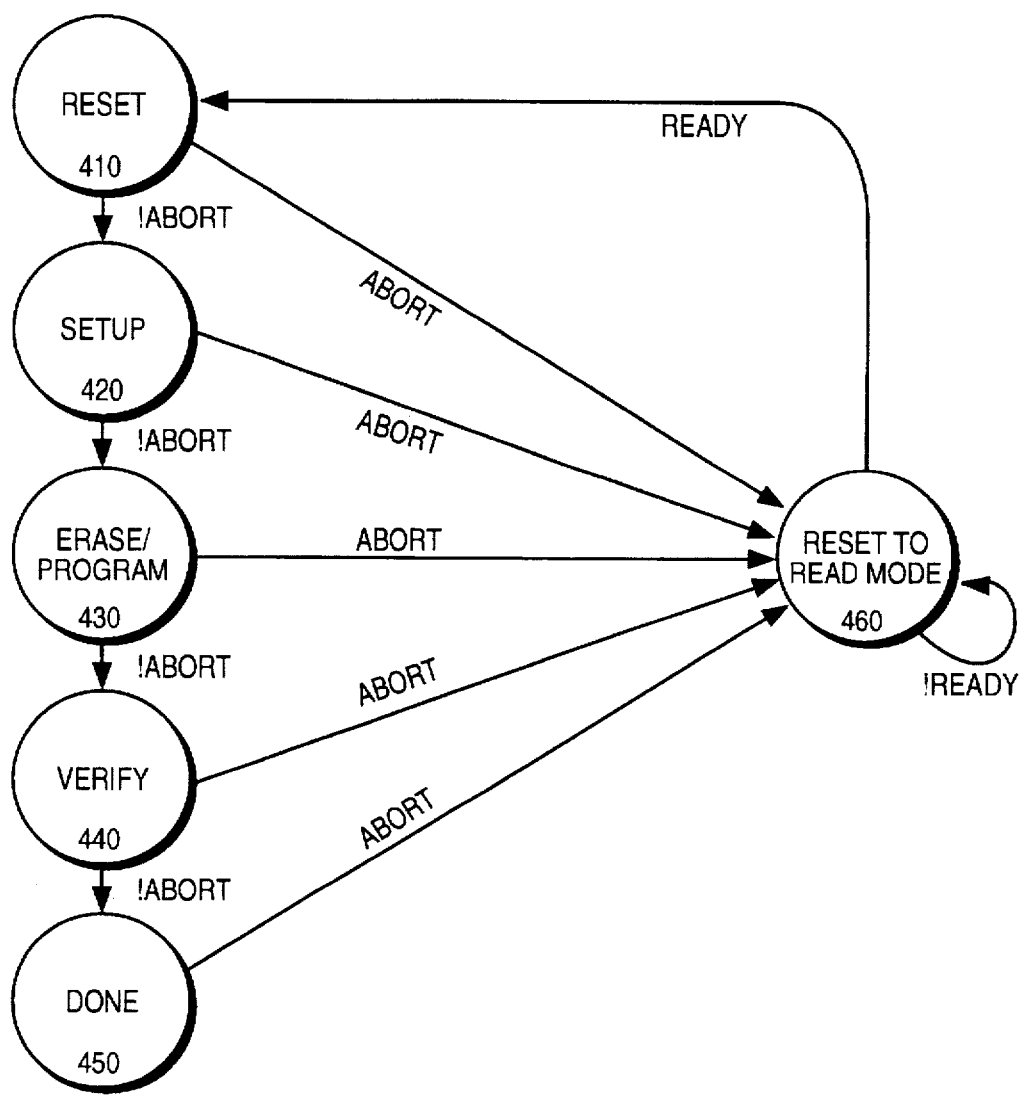
FIG. 4 is a state diagram of a write state machine in accordance with one embodiment.

An embodiment of the state diagram of the write state machine 130 is illustrated in FIG. 4. The write state machine 130 starts in the "reset" state 410, waiting to be alerted by the command user interface 150. Once the write state machine 130 has been alerted of an erase or program request, it proceeds to "setup" state 420 if the abort signal 121 is not active (IABORT). The setup state 420 prepares the flash memory device 100 for either an erase or program operation. The write state machine 130 then proceeds to the next state 430 if the abort signal 121 is not active. In state 430, the appropriate block of the flash memory array 190 is either erased or programmed. If the abort signal 121 is not active, the write state machine proceeds to the "verify" state 440, where the block of the flash memory array 190 is checked to ensure the erase or program was successfully completed. If the block was not successfully completed, prior write state machines employ methods of reinitiating the erase or program operation either until the block is verified, or the block operation is deemed unsuccessful, or "times out" (not shown). Once the block has been verified, the write state machine 130 sequences to the "done" state 450 if the abort signal 121 is not active. In state 450, the voltage control circuitry 170 removes high power from the flash memory array 190 and the command user interface 150 waits for a command from the microprocessor 110 to read the status register 160.

If an active abort signal on line 121 ("ABORT") is detected in any of the states 410–450, the write state machine 130 enters the "reset to read mode" state 460. In state 460, the voltage control circuitry 170 removes high power from the flash memory array 190. Once the voltage control circuitry 170 has completed, it sends an active ready signal ("READY") to the write state machine 130. When the active ready signal is received, the reset state 410 is entered and the write state machine 130 sits idle.

Figure 5:
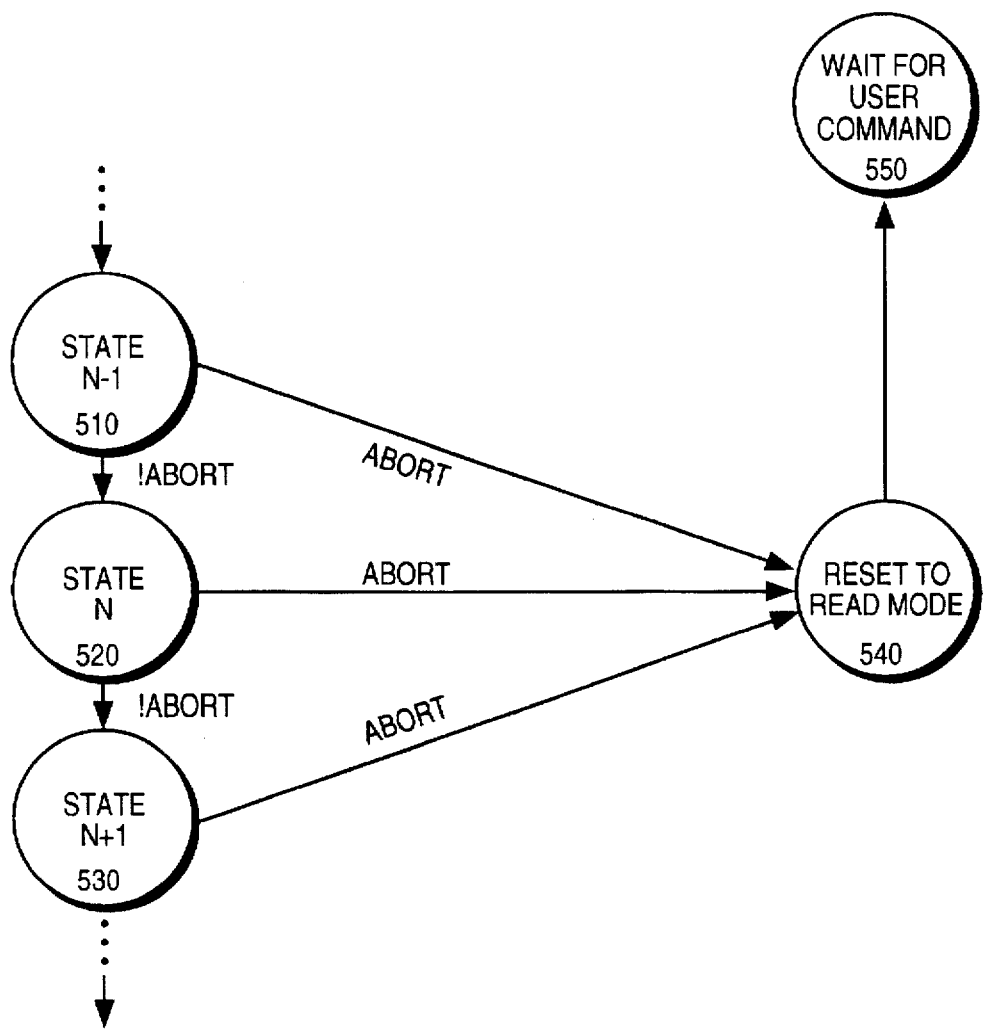
FIG. 5 is a portion of a state diagram of a write state machine that incorporates an abort feature.

The abort method described in reference to FIG. 4 is not limited to a write state machine incorporating states 410–450. For instance, a more general write state diagram using the abort method is illustrated in FIG. 5. The write state machine 130 sequences through many various states during erasure and programming. State (N−1) 510, state (N) 520, and state (N+1) 530 represent any three states within the program and erase sequences. The write state machine 130 detects the assertion of the abort signal 121 at state (N−1) 510, and only proceeds to the next state (N) 520 if the abort signal 121 is not active. Similarly, state (N) proceeds to state (N+1) only if the abort signal 121 is not active. If at any time during the states 510–530 an active abort signal on line 121 is detected, the "reset to read mode" state 540 is entered. Once the flash memory device 100 has been reset to read mode, the write state machine 130 waits for the next microprocessor command, as is illustrated by state 550. The microprocessor 110 may then assert any command to the flash memory device 100.

Thus, in the foregoing detailed description a flash memory device and method of aborting an automatic program or erase sequence have been described. The flash memory device employs a write state machine for automatically sequencing through a number of erase or program operations performed on a block of a flash memory array. The method enables the microprocessor to abort the erase or program sequence during any operation and regain control of the flash memory device for reading and writing.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of aborting an automated write sequence in a memory device, the method comprising the steps of:

(A) commencing the write sequence upon receipt of a command, wherein the write sequence includes a plurality of operations being performed by a write state machine on a nonvolatile memory array of the memory device;

(B) detecting an abort signal during each operation of the write sequence, the abort signal capable of being in one of a first and second state;

(C) halting the write sequence by ramping down a write voltage supplied to the nonvolatile memory array if the write state machine detects the abort signal in the first state, and continuing with the write sequence if the write state machine detects the abort signal in the second state; and (D) placing the nonvolatile memory array in a read-only mode if the abort signal is in the first state.

2. The method of claim 1, wherein the abort signal is asserted on an abort pin coupled to the memory device.

3. The method of claim 2, wherein step (A) commences only if the abort signal is in the second state when the memory device receives the command.

4. The method of claim 1, wherein the write sequence is an erase sequence for erasing a block in the nonvolatile memory array.

5. The method of claim 1, wherein the write sequence is a program sequence for programming data in a block of the nonvolatile memory array.

6. The method of claim 1, wherein the memory device is a flash electrically erasable programmable read only memory (EEPROM).

7. A method of aborting an automated write sequence in a memory device, the memory device including a write state machine, voltage control circuitry, and a nonvolatile memory array, the method comprising the steps of:

(A) initiating the write sequence, wherein the write sequence is performed by the write state machine on the nonvolatile memory array of the memory device;

(B) aborting the write sequence once the write sequence has commenced, wherein the write state machine halts the write sequence and the voltage control circuitry places the nonvolatile memory array in a read-only mode by ramping down a write voltage supplied to the nonvolatile memory array; and (C) subsequently reading data from the nonvolatile memory array.

8. The method of claim 7, wherein aborting the write sequence of step (B) further comprises the step of asserting an abort signal on an abort pin coupled to the memory device.

9. The method of claim 7, wherein aborting the write sequence of step (B) further comprises the step of coupling an abort command to the memory device.

10. The method of claim 7, wherein the write sequence is an erase sequence for erasing a block of the nonvolatile memory array.

11. The method of claim 7, wherein the write sequence is a program sequence for programming data in a block of the nonvolatile memory array.

12. The method of claim 7, wherein the memory device is a flash electrically erasable programmable read only memory (EEPROM).

13. A flash memory device, comprising:

(A) a flash memory array capable of being erased and programmed;

(B) a voltage control circuit for placing the flash memory array in a read-only mode;

(C) a write state machine, coupled to the voltage control circuit, for automatically performing a write sequence on the flash memory array upon receipt of a command, wherein the write sequence includes a plurality of operations; and (D) an abort signal, coupled to the write state machine, such that each operation of the write sequence is performed if the abort signal is in a second state, and the write sequence is aborted if the abort signal is in a first state, wherein when the write sequence is aborted the voltage control circuitry puts the flash memory array into the read-only mode by ramping down a write voltage supplied to the flash memory array.

14. The flash memory device of claim 13, wherein the write sequence is an erase sequence for erasing a block of the flash memory array.

15. The flash memory device of claim 13, wherein the write sequence is a programming sequence for programming data in a block of the flash memory array.

16. The flash memory device of claim 13, further comprising an abort pin for receiving the abort signal.

17. memory device, comprising:

(A) means for automatically performing a write sequence upon receipt of a command, wherein the write sequence includes a plurality of operations being performed on a nonvolatile memory array;

(B) means for detecting an abort signal during each operation of the write sequence, the abort signal capable of being in one of a first and second state;

(C) means for halting the write sequence by ramping down a write voltage supplied to the nonvolatile memory array if the abort signal is detected in the first state, and continuing with the write sequence if the abort signal is detected in the second state; and (D) means for placing the nonvolatile memory array in a read-only mode if abort signal is detected in the first state.

* * * * *